United States Patent
Maki

(10) Patent No.: US 7,327,599 B2
(45) Date of Patent: Feb. 5, 2008

(54) SEMICONDUCTOR MEMORY DEVICE

(75) Inventor: Yasuhiko Maki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/494,746

(22) Filed: Jul. 28, 2006

(65) Prior Publication Data
US 2007/0201263 A1 Aug. 30, 2007

(30) Foreign Application Priority Data
Feb. 27, 2006 (JP) ............................. 2006-051017

(51) Int. Cl.
G11C 11/00 (2006.01)
G11C 7/00 (2006.01)

(52) U.S. Cl. ...................... 365/154; 365/191
(58) Field of Classification Search ................ 365/154, 365/155
See application file for complete search history.

(56) References Cited
U.S. PATENT DOCUMENTS
2007/0014169 A1* 1/2007 Takahashi et al. .......... 365/203

FOREIGN PATENT DOCUMENTS

| JP | 2782682 B2 | 5/1998 |
|---|---|---|
| JP | 2001-257275 A | 9/2001 |
| JP | 2003-86713 A | 3/2003 |

* cited by examiner

Primary Examiner—Ly Duy Pham
(74) Attorney, Agent, or Firm—Arent Fox LLP

(57) ABSTRACT

Included are first and second inverters 1L, 1R, a first selection transistor N1 controlling a connection of an output terminal of the first inverter 1L to a bit line 11, and a second selection transistor N2 controlling a connection of an output terminal of the second inverter 1R to a bit line 12, wherein the first inverter 1L having a first load transistor P1 and a first drive transistor N3 and the second inverter 1R having a second load transistor P2 and a second drive transistor N4, function as a memory cell 1, and a ratio of a driving current quantity that can be outputted in an ON-state of the first drive transistor N3 to a driving current quantity that can be outputted in an ON-state of the first selection transistor N1, is larger than a first predetermined value.

5 Claims, 4 Drawing Sheets

SEMICONDUCTOR MEMORY DEVICE

BACKGROUND OF THE INVENTION

The present invention relates to a semiconductor memory device in which a pair of inverters is flip-flop-connected thereby to configure an SRAM cell.

In manufacturing the semiconductor device, as a result of advancement of a more refined structure of a transistor owing to evolutions in technologies, there increases variation in characteristic between the transistors adjacent to each other within a semiconductor chip. By the way, stability of the memory cell is attributed to an operating lower limit voltage of the SRAM. Accordingly, it is required for enabling the operation of the SRAM under a much lower operating voltage the stability be improved by restraining variation in characteristic of the memory cell. Then, basically a cell is required to be upsized by increasing a transistor size in the memory cell in order to ensure the stability of the memory cell.

[Patent document 1] Japanese Patent Application Laid-Open Publication No. 2001-257275

[Patent document 2] Japanese Patent Application Laid-Open Publication No. 2003-86713

[Patent document 3] Japanese Patent Application Publication No. 2782682

SUMMARY OF THE INVENTION

When increasing dimensions of the transistor, however, as a matter of course, dimensions of the memory cell rise, then a micro size increases, and finally this results in enlargement of a chip size.

It is an object of the present invention to provide a semiconductor memory device in which the stability of the memory cell is improved even when restraining the increase in the dimensions of the memory cell including the transistor.

[Means for solving the Problems]

The present invention adopts the following means in order to solve the problems. Namely, the present invention is exemplified as a semiconductor memory device including a memory cell comprising first and second inverters each having an output terminal that is mutually connected to an input terminal of the other first or second inverter, a first selection transistor controlling a connection of the output terminal of the first inverter to a bit line, and a second selection transistor controlling a connection of the output terminal of the second inverter to another bit line, wherein the first inverter includes a first load transistor connected to a power source and a first drive transistor connected to the power source via the first load transistor and switched over in its ON/OFF-states, wherein a common terminal between the first load transistor and the first drive transistor forms the output terminal of the first inverter, and a connection terminal connecting a gate of the first load transistor to a gate of the first drive transistor forms the input terminal of the first inverter, wherein the second inverter includes a second load transistor connected to the power source and a second drive transistor connected to the power source via the second load transistor and switched over in its ON/OFF-states, wherein a common terminal between the second load transistor and the second drive transistor forms the output terminal of the second inverter, and a connection terminal connecting a gate of the second load transistor to a gate of the second drive transistor forms the input terminal of the second inverter, wherein when the first inverter is switched ON, the second inverter is switched OFF, and, when the second inverter is switched ON, the first inverter is switched OFF, thus functioning as the memory cell, wherein when writing data to the memory cell, the first selection transistor and the second transistor are switched ON thereby to input the data to the second inverter as well as to the first inverter, and, when reading the data from the memory cell, the first selection transistor is switched ON, the data is read from the first inverter while the second selection transistor is switched OFF, and wherein a ratio of a driving current quantity that can be outputted in the ON-state of the first drive transistor to a driving current quantity that can be outputted in the ON-state of the first selection transistor, is larger than a first predetermined value.

According to the present invention, the stability of the memory cell can be improved even when restraining the increase in the dimensions of the memory cell including the transistor.

DETAILED DESCRIPTION OF THE INVENTION

A semiconductor memory device according to a best mode (which will hereinafter be termed an embodiment) for carrying out the present invention will hereinafter be described with reference to the drawings. Configurations in the following embodiments are exemplifications, and the present invention is not limited to the configurations in the embodiments.

<Substance of the Invention>

It is required for attaining a stable operation of a memory cell to satisfy two items contrary to each other, which are (1) a hold characteristic and (2) a write characteristic. Herein, the hold characteristic represents a characteristic that stabilizes and thus holds data of the memory cell. The hold characteristic can also be said to be a degree of how difficult the data within the memory cell is inverted. On the other hand, the write characteristic represents a degree of a write speed and how small a write error is. The write characteristic can also be said to be a degree of how easy the data is written to the memory cell.

Further, the phrase "contrary to each other" connotes that the memory cell having the characteristic hard to be inverted gets worsened in its write characteristic and generally decreases in its write speed. Further, this generally implies a case, wherein when trying to improve the write speed, the hold characteristic is deteriorated.

Then, a requirement for maintaining and further improving the characteristics described above involves basically increasing dimensions (width/length) of a transistor configuring the memory cell and decreasing variation of characteristic of the transistor within a semiconductor chip.

A phenomenon that the inversion of the memory cell data occurs in an SRAM can be categorized as follows.

To begin with, at a reading time, a category (a) is a phenomenon that the memory cell of which word line is selected and column is selected is inverted when reading. A category (b) is a phenomenon that the memory cell of which the word line is selected and column is not selected is inverted in a non-selection state.

Next, at a writing time, a category (c) is a phenomenon that the memory cell of which the word line is selected and the column is not selected is inverted in the non-selection state. This may be considered to be the same phenomenon as the category (b) at the reading time.

In the first embodiment, an example of a circuit configuration for reducing defects of these categories a), b) and c) and for minimizing an increase in cell dimensions, will be explained.

First Embodiment

Figure 1:
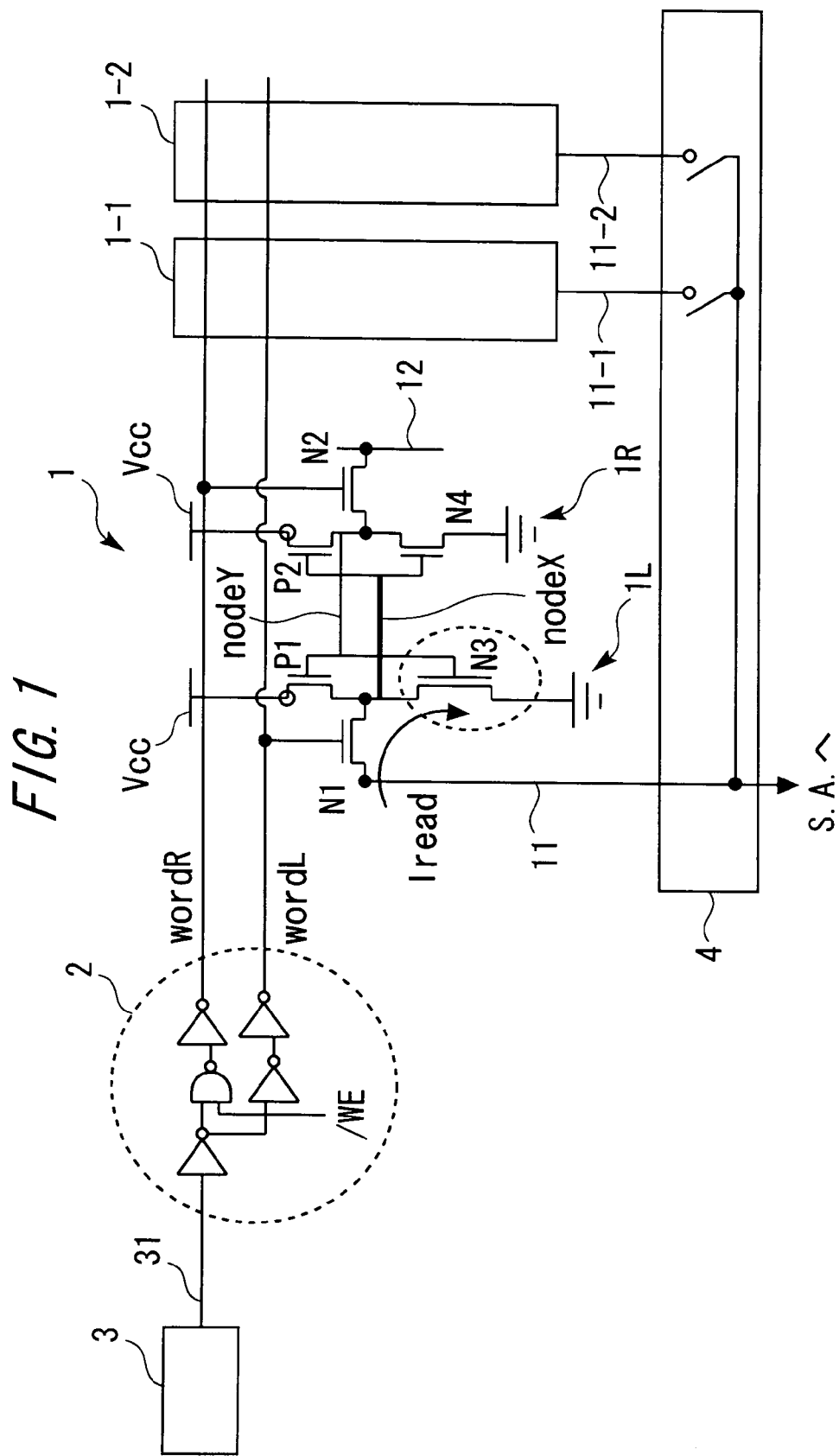
FIG. 1 is a diagram of a configuration of a semiconductor memory device according to a first embodiment of the present invention.

FIG. 1 is a diagram of a configuration of the memory cell of the semiconductor memory device according to a first embodiment of the present invention. FIG. 1 shows a memory cell 1 stored with data for 1 bit of the SRAM, a row switch 3 for selecting a word line 31 to which the memory cell 1 is connected based on designation of a row address from within a cell array configured by the memory cells 1, and a mode switchover circuit 2 that generates a signal (a signal of wordL) when reading the data and signals (a signal of wordL and a signal of wordR) when writing the data from the signals of the word line 31 according to a write enable signal (a signal of /WE).

In the memory cell 1, each of input terminals of a pair of inverters 1L, 1R (corresponding respectively to a first inverter and a second inverter according to the present invention) is mutually connected to an output terminal of the other inverter 1L or 1R, thus configuring a flip-flop circuit. To be specific, the inverter 1L is constructed of a load transistor P1 (corresponding to a first load transistor according to the present invention) of which a source is connected to a power source voltage Vcc, and a drive transistor N3 (corresponding to a first drive transistor according to the present invention) that drives the load transistor P1.

The load transistor P1 and the drive transistor N3 are common in their drain and form the output terminal of the inverter 1L. This output terminal (the common drain) is connected to a bit line 11 via the transistor N1 (which is also referred to as a transfer gate and corresponds to a first selection transistor according to the present invention) constructing a switch. Further, a gate of the transistor N1 is connected to a first branch word line wordL.

Moreover, gates of the load transistor P1 and of the drive transistor N3 are connected to each other, thereby constructing a common gate terminal. This common gate forms the input terminal of the inverter 1L. Further, a source of the drive transistor N3 is grounded (or connected to the negative power source voltage Vss).

Similarly, the inverter 1R is constructed of a load transistor P2 (corresponding to a second load transistor according to the present invention) of which a source is connected to the power source voltage Vcc, and a drive transistor N4 (corresponding to a second drive transistor according to the present invention) that drives the load transistor P2.

The load transistor P2 and the drive transistor N4 are common in their drain and form the output terminal of the inverter 1R. This output terminal (the common drain) is connected to a bit line 12 via the transistor N2 (corresponding to a second selection transistor according to the present invention) constructing a switch. Further, a gate of the transistor N2 is connected to a second branch word line wordR.

Moreover, gates of the load transistor P2 and of the drive transistor N4 are connected to each other, thereby constructing a common gate terminal. This common gate forms the input terminal of the inverter 1R. Further, a source of the drive transistor N4 is grounded (or connected to a negative power source voltage Vss).

As in FIG. 1, the output terminal (the common drain) of the inverter 1L is connected to the common gate terminal of the inverter 1R, thus forming nodeX. Similarly, the output terminal (the common drain) of the inverter 1R is connected to the common gate terminal of the inverter 1L, thus forming nodeY.

Thus, the inverter 1L and the inverter 1R are flip-flip-connected, and nodeX and nodeY take a complementary state to each other. Namely, when the drive transistor N3 is switched ON, nodeX is grounded (or connected to the negative power source voltage Vss) thereby becoming a state (LO).

At this time, a gate potential of a drive transistor N4 becomes smaller than a threshold value and is therefore switched OFF, while a gate of a P-type load transistor P2 becomes smaller than the threshold value and is therefore switched ON. As a result, nodeY comes to a state (HI) of being connected to the positive power source voltage Vcc. Then, a potential of nodeY connected to the positive power source voltage Vcc is supplied directly to the common gate terminal of the inverter 1L, thereby keeping the state described above.

Now, such a case is considered that the data is read from the memory cell 1 in this state. The memory cell 1, when writing, executes an operation of writing the complementary data respectively to both of the inverter 1L and the inverter 1R via the transistors N1 and N2. On the other hand, the memory cell 1, when reading, reads only one complementary data from only the transistor N1 into a sense amplifier via the bit line 11.

In the case of this reading operation, at first, the bit line 11 is precharged with a predetermined potential. Next, the word line 31 comes to the selection state (LO) through the row switch 3, and the write enable signal /WE becomes LO. As a result, the first branch word line wordL is assorted to HI.

On the other hand, the second branch word line wordR is fixed to LO by the write enable signal /WE (LO state). Accordingly, the transistor N2 is kept in the OFF-state and cuts the bit line 12 off from the drive transistor N4.

Accordingly, the transistor N1 is switched ON and connects the bit line 11 to the drive transistor N3. As a consequence, an electric current flows to the drive transistor N3 via the transistor N1 from the precharged bit line 11.

In this case, if a driving capability of the drive transistor is well larger than a driving capability of the transistor N1 forming the transfer gate, an influence of the inflow electric current can be almost ignored. In the normal type of SRAM having a configuration of including the load transistors P1 and P2, however, a driving capability ratio of the transistor N1 serving as the transfer gate to the drive transistor N3 is set to approximately 1.5 (corresponding to a second predetermined value according to the present invention). Note that the driving capability ratio of the transistor N2 serving as the transfer gate to the drive transistor N4 is also set to approximately 1.5.

If the driving capability ratios between the transfer gates (N1, N2) and the drive transistors N3, N4 are set too large, a data writing operation gets slow. Further, it is required for augmenting the driving capabilities of the drive transistors N3, N4 that gate dimensions (width and length W/L) be increased. It follows that the dimensions of the transistor, i.e., cell dimensions and chip dimensions, increase. Therefore, the driving capability ratio is in many cases set to approximately 1.5.

If the driving capability of the drive transistor is not well larger than the driving capability of the transistor N1 forming the transfer gate, however, a malfunction occurs due to the inversions of the states of the inverters 1R and 1L. Namely, when the electric current flows to the drive transistor N3 via the transistor N1 from the precharged bit line 11, a voltage drop is caused by a reading current Iread flowing through the transistor N3. This voltage drop leads to a rise in the potential of the drain of the drive transistor N3, which is, i.e., the potential of nodeX.

If the potential of nodeX exceeds the threshold value of, e.g., the drive transistor N4 kept OFF, the drive transistor N4 is switched ON. Further, the P-type load transistor P2 is switched OFF. Then, the potential of the drain of the drive transistor N4, which is, i.e., the potential of nodeY, becomes LO (a ground voltage or the negative power source voltage Vss).

As a result, the drive transistor N3 is switched OFF. Further, the P-type load transistor P1 is switched ON. Then, the potential of the drain of the drive transistor N3, which is, i.e., the potential of nodeX, becomes HI (the positive power source voltage Vcc). Thus, the data of the inverters 1L and 1R, i.e., the data of the memory cell, are inverted due to an inflow of electric charges from the bit line, thereby causing the malfunction. As described above, there exist subjects contrary to each other in pursuit of stability of the memory cell and in pursuit of more refined cell dimensions.

Such being the case, the semiconductor device in the first embodiment adopts the following configuration. Herein, in the same way as above, the memory cell 1, when writing, executes the operation of writing the complementary data respectively to both of the inverter 1L and the inverter 1R via the transistors N1 and N2. On the other hand, the memory cell 1, when reading, reads only one complementary data from only the transistor N1 into the sense amplifier via the bit line 11.

In this type of memory cell 1, the driving capability of the drive transistor N3 with respect to the transistor N1 as the transfer gate to the inverter 1L is set to approximately a 2-fold value (corresponding to a first predetermined value according to the present invention). On the other hand, the driving capability of the drive transistor N4 with respect to the transistor N2 as the transfer gate to the inverter 1R is set to approximately a 1.5-fold value. As for the driving capabilities of the transistors N1 and N2, i.e., supposing that these transistors are much the same in their areas, the driving capability of the drive transistor N3 is set approximately 4/3 as much as the driving capability of the drive transistor N4.

With this construction, in the semiconductor memory device in the first embodiment, when reading the data from the memory cell 1, in the case of reading only one complementary data from the inverter 1L, the driving capability of the drive transistor N3 is well larger than that of the transistor N1 serving as the transfer gate. Hence, a rise in the potential of nodeX due to the data reading current Iread is restrained. Accordingly, the possibility of the data inversion of the memory cell 1 is reduced, whereby the data can be stably read from the memory cell 1.

On the other hand, when writing the data, the data are written to both of the complementary data, and therefore, at least on the side of the inverter 1R, the ratio of the driving capability of the transistor N2 as the transfer gate to the driving capability of the drive transistor N4 is not so small as on the side of the inverter 1L. Hence, also when writing the data, the writing speed can be restrained from decreasing.

Moreover, FIG. 1 illustrates memory cells 1-1, 1-2, etc that are selected together with the memory cell 1 by the first branch word line wordL but are neither selected by a column switch nor connected to the sense amplifier. In these memory cells 1-1, 1-2, etc, as in the case of the memory cell 1, bit lines 11-1, 11-2, etc are precharged, and hence the conventional configuration has the possibility of the inversion similarly to the above-mentioned. By taking the configuration in the first embodiment, however, also in these memory cells 1-1, 1-2, etc, as in the case of the memory cell 1, the driving capability of the drive transistor through which the reading current Iread flows is well larger than that of the transfer gate. Therefore, the rise in the potential of the node corresponding to nodeX due to the data reading current Iread is restrained. Accordingly, also in the memory cell that is non-selected by the column switch, the possibility of the data inversion is reduced. Further, in writing the data to the memory cells 1-1, 1-2, etc, as in the case of the memory cell 1, the writing speed can be restrained from decreasing.

Second Embodiment

The semiconductor memory device according to a second embodiment of the present invention will be described with reference to FIGS. 2, 3A and 3B. The first embodiment has given the discussion on the memory cell 1 of the SRAM, wherein the data is read in the way that only one of the pair of inverters configuring the flip-flop is selected by the first branch word line. In this case, the driving capability of the drive transistor N3 through which the reading current Iread flows is set approximately twice as large as that of the transfer gate.

Given in the second embodiment is an explanation of an example of contriving a layout of the cell array where a plurality of such memory cells is arrayed. Other configurations and operations are the same as those in the first embodiments. This being the case, the same components are marked with the same numerals and symbols, and their explanations are omitted. Further, the drawing in FIG. 1 is referred to when the necessity may arise.

Figure 2:
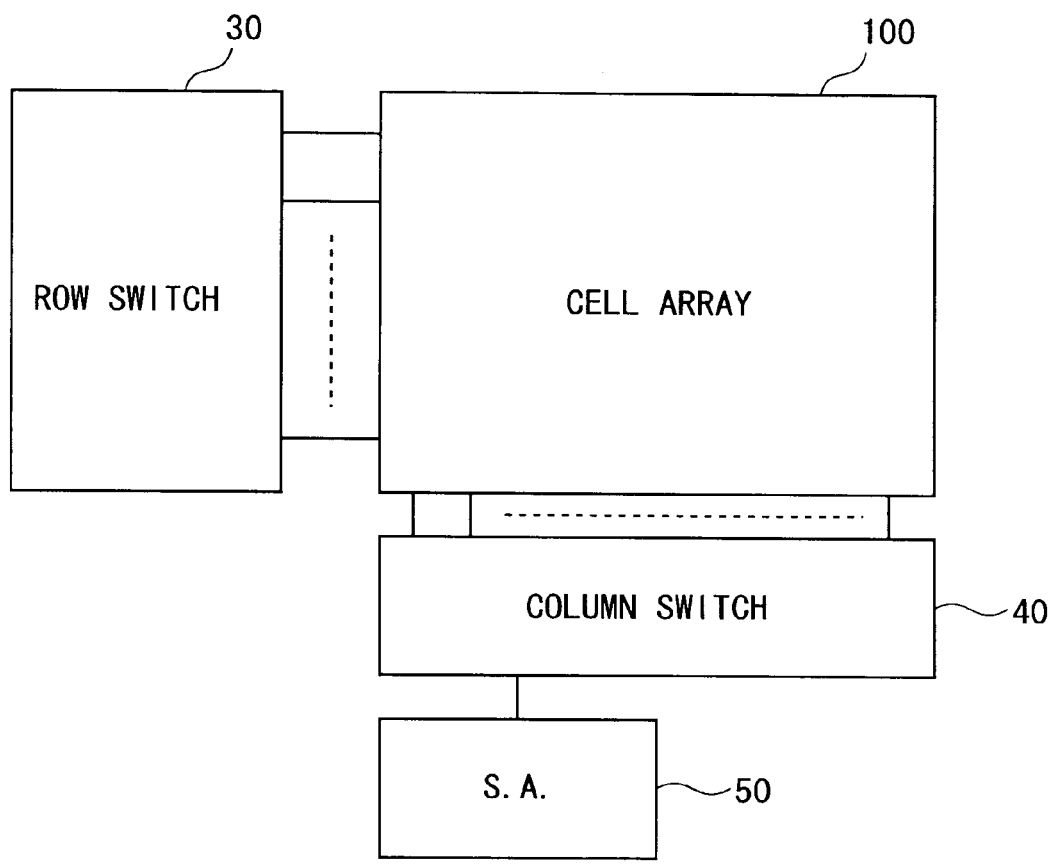
FIG. 2 is a diagram of a layout of the cell array of the semiconductor memory device according to a second embodiment of the present invention.

FIG. 2 is a diagram of a layout of the cell array of the semiconductor memory device according to a second embodiment of the present invention. As shown in FIG. 2, this semiconductor memory device has a cell array 100 including the same memory cell as the memory cell 1 in the first embodiment, a line of row switches (row switch line) 30 for selecting the memory cells (connected to the same word line) arranged in the same row direction from the cell array 100, a line of column switches (column switch line) 40 for selecting the memory cells arranged in a column direction via the bit line from the plurality of memory cells selected by the row switches, and a line of sense amplifiers (sense amplifier line) 50 for amplifying detection signals given from the memory cells selected by the column switches and judging a data value.

The cell array has the memory cells 1 for, e.g., (2 n×2 m) bits. The row switches select the memory cells 1 for 2 m bits (for 1 word). This function is called a word selecting function. Further, the column switches select 2 k bits from the 2 m bits of the row (which is a line of the memory cells 1 having the same row address) accessed by the row switches, and connects the selected 2 k bits to k-pieces of sense amplifiers.

Figure 3A:
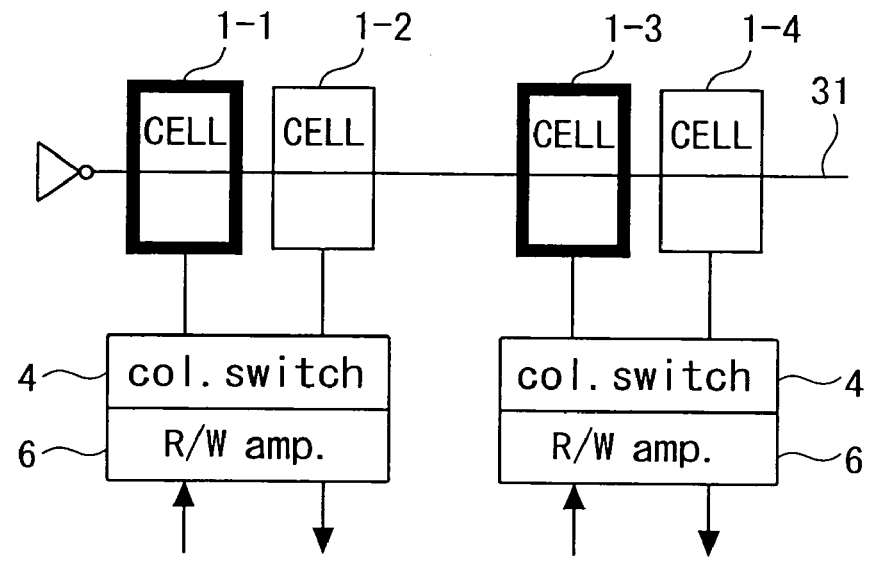
FIG. 3A is a diagram showing a relationship between conventional row selection and column selection.
Figure 3B:
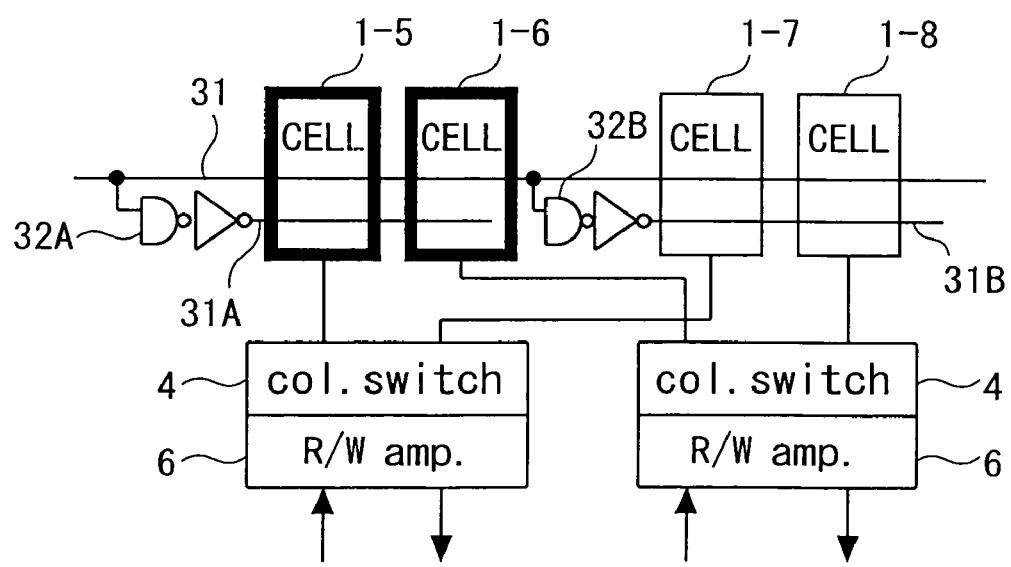
FIG. 3B is a diagram showing arrangement of the memory cells for reducing data inversion when reading.

FIGS. 3A and 3B show a relationship between the cells selected by the row switch and the cells selected by the column switch. FIG. 3A is a diagram showing a relationship between the conventional row selection and column selection. The data writing operation in this case will be examined. In the conventional configuration, the memory cells 1-1 through 1-4 having the same row address are selected by the word line 31. Further, the memory cells 1-1 and 1-3 are selected by the column switch 4 and are connected to read/write amplifiers 6. It is to be noted that the sense amplifier in FIG. 1 is constructed by combining, for instance, the read/write amplifier 6 in FIG. 3A with a comparator. Namely, the read/write amplifier 6 occupies a front half portion of the sense amplifier, and, when reading, amplifies and inputs the reading signal to the comparator.

In this case, in the writing operation, there are switched ON the transfer gates (the transistors N1, N2 in FIG. 1) leading to the pair of inverters (1L, 1R in FIG. 1) having the complementary relationship with respect to the word line 31 (the first branch word line wordL and the second branch word line wordR in the case of FIG. 1). Therefore, the electric charges of the pair of precharged bit lines flow to the respective inverters (1L, 1R in FIG. 1) from the memory cells 1-1 through 1-4 via the individual transfer gates.

Among those memory cells, the memory cell 1-1 is selected by the column switch 4, and therefore the write data is inputted via the transfer gate from the read/write amplifier 6.

On the other hand, the memory cell 1-2 is not selected by the column switch 4, and hence it does not happen that the write data is inputted. The transfer gate of the memory cell 1-2 is switched ON through the word line 31. At this time, if the write data is not inputted, the pair of bit lines of the memory cell not defined as the write target cell is in a floating state. Accordingly, as understood from the configuration of the memory cell 1 in FIG. 1, the memory cells 1-2, 1-4, etc are in the same state as the read target cell is.

Therefore, if a value "1" (the value=1 (nodeY=LO)) is set in the memory cells not defined as the write target cells such as the memory cells 1-2, 1-4, etc, there rises a drain potential of the drive transistor (which is, e.g., N4 in FIG. 1) whose driving capability is not set approximately twice as large as that of the transfer gate. Accordingly, even when using the memory cell 1 in the first embodiment, the same phenomenon as when conventionally reading the memory cell occurs and the data inversion also occurs in the memory cells (1-2, 1-4, etc in FIG. 3A) that undergo not the column selection but the word selection in the writing operation.

FIG. 3B shows arrangement of the memory cells for reducing the data inversion when writing. In FIG. 3, the word line 31 is segmented into a plurality of word line segments 31A, 31B, etc by control gates 32A, 32B, etc. The memory cells 1-5 and 1-6 are connected to the word line segment 31A. Further, the memory cells 1-7 and 1-8 are connected to the word line segment 31B.

In FIG. 3B, the control gate 32A is switched ON, whereby the transfer gates of the cells 1-5 and 1-6 become the ON-state. While on the other hand, the control gate 32B is switched OFF, whereby the transfer gates of the cells 1-7 and 1-8 become the OFF-state.

Then, the cells 1-5 and 1-6 selected by the word line are each connected to the read/write amplifiers 6. Thus, in the configuration in FIG. 3B, the memory cells undergoing the word selection by the word line segment 31A (or 31B) are each subjected to the column selection and are each connected to the read/write amplifiers 6. Hence, in the configuration in FIG. 3B, the data are invariably written to the memory cells (1-5, 1-6, etc) undergoing the word selection.

On the other hand, it does not happen that the memory cells (1-7, 1-8, etc) not subjected to the column selection undergo the word selection. Accordingly, when writing the data, in the memory cells 1-7, 1-8, etc excluding the memory cells 1-5, 1-6, etc defined as the data write target cells, the transfer gates are in the OFF-state, and the same electric current as when reading the data does not flow to the drive transistors.

Hence, in the configuration in FIG. 3B, if the memory cell 1 in the first embodiment is applied to the memory cell 1-8 from the memory cell 1-5, the possibility of the data inversion occurred when writing the data can be reduced.

Third Embodiment

The semiconductor memory device according to a third embodiment of the present invention will be explained with reference to FIG. 4. The first embodiment has exemplified, in the memory cell 1 of the SRAM, the example in which the driving capability of the drive transistor N3 to which the reading current Iread flows is set approximately twice as large as that of the transfer gate.

The third embodiment will exemplify an example of applying the configuration in the first embodiment to a 2-port memory. Other configurations and operations are the same as those in the first embodiments discussed above. Such being the case, the same components are marked with the same numerals and symbols, and their explanations are omitted. Further, the drawing in FIG. 1 is referred to when the necessity may arise.

Figure 4:
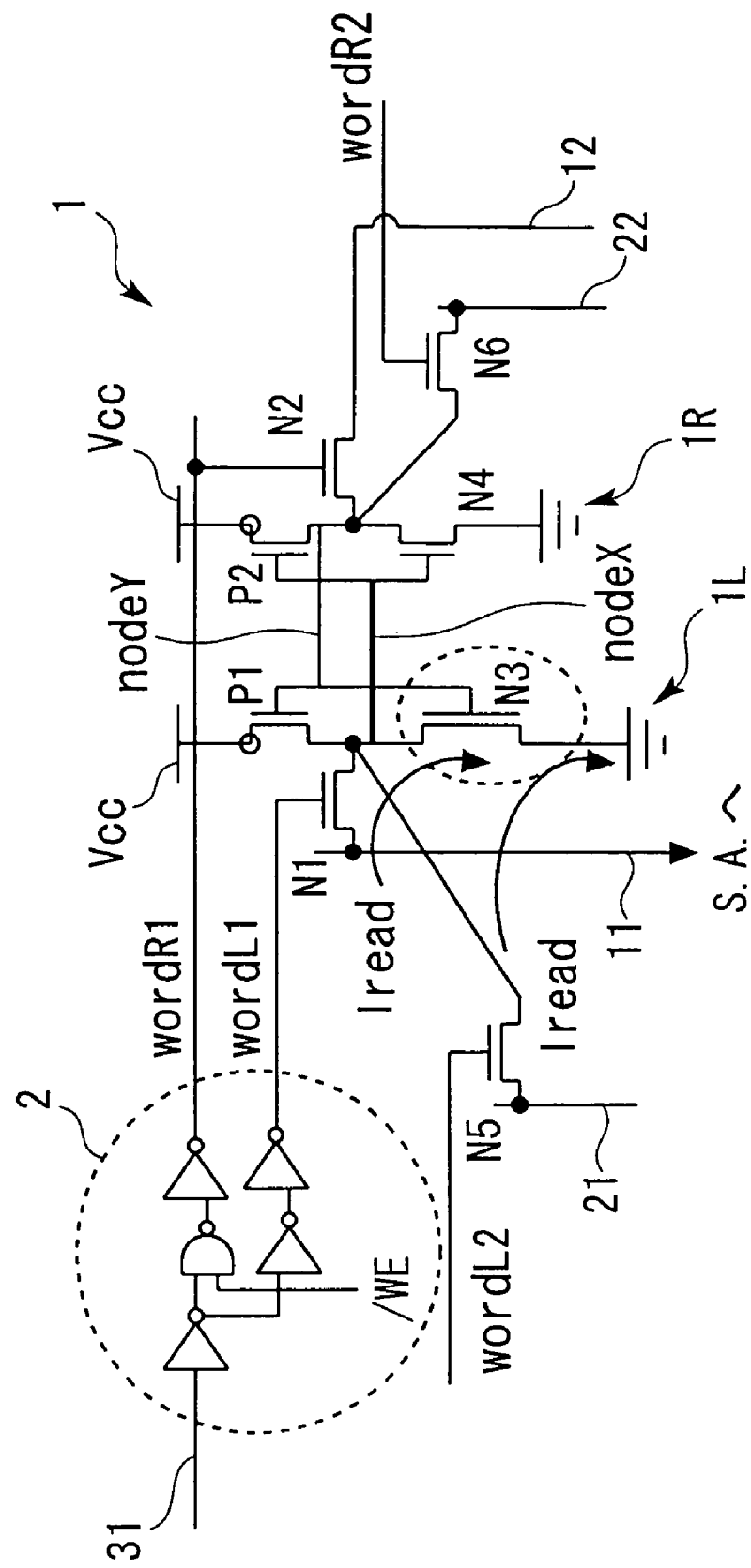
FIG. 4 is a diagram of a configuration of the semiconductor memory device according to a third embodiment of the present invention.

FIG. 4 shows the memory cell 1 stored with the data for 1 bit of the SRAM, the word line 31 connected to the memory cell 1 according to designation of a row address from within the cell array configured by the memory cells 1, and the mode switchover circuit 2 that generates the signal (the signal of wordL) when reading the data and the signals (the signal of wordL and the signal of wordR) when writing the data from the signals of the word line 31 according to the write enable signal (the signal of /WE).

In the memory cell 1, each of the input terminals of the pair of inverters 1L, 1R is mutually connected to an output terminal of the other inverter 1L or 1R, thus configuring the flip-flop circuit. Further, also in FIG. 4, the load transistor P1 and the drive transistor N3 are common in their drains forming the output terminal of the inverter 1L. This output terminal (the common drain, nodeX) is connected to the bit line 11 via the transistor N1 constructing the switch. Further, the gate of the transistor N1 is connected to a first left branch word line wordL1.

In the configuration in FIG. 4, however, the output terminal (the common drain, nodeX) of the inverter 1L is further connected to a bit line 21 via the transistor N5. Moreover, the gate of the transistor N5 is connected to a second left branch word line wordL2. Thus, a 2-port access via the bit lines 11 and 12 to the nodeX defined as the output terminal of the inverter 1L, can be made.

Similarly, the inverter 1R is constructed of the load transistor P2 of which the source is connected to the power source voltage Vcc, and the drive transistor N4 that drives the load transistor P2. The load transistor P2 and the drive transistor N4 are common in their drains forming the output terminal of the inverter 1R. This output terminal (the common drain, nodeY) is connected to a bit line 22 via the transistor N2 constructing the switch. Further, the transistor N2 is connected to a first right branch word line wordR1.

Moreover, in the configuration in FIG. 4, the output terminal (the common drain, nodeY) of the inverter 1R is further connected to the bit line 22 via the transistor N6. Further, the gate of the transistor N6 is connected to a second right branch word line wordR2. Thus, a 2-port access via the bit lines 12 and 22 to the nodeY defined as the output terminal of the inverter 1R, can be made.

In the configuration in FIG. 4, the driving capability of the drive transistor N3 with respect to the transistor N1 as the transfer gate connected to the inverter 1L is set to approximately a 4-fold value (corresponding to a first predetermined value according to the present invention). On the other hand, the driving capability of the drive transistor N4 with respect to the transistor N2 as the transfer gate connected to the inverter 1R is set to approximately a 3-fold value (corresponding to a second predetermined value according to the present invention). As for the driving capabilities of the transistors N1 and N2, i.e., supposing that these transistors are much the same in their areas, the driving capability of the drive transistor N3 is set approximately 4/3 as much as the driving capability of the drive transistor N4.

With this construction, in the semiconductor memory device in the third embodiment, when reading the data from the memory cell 1, in the case of reading only one complementary data from the inverter 1L, the driving capability of the drive transistor N3 is well larger than that of the transistor N1 serving as the transfer gate. Hence, the rise in the potential of nodeX due to the data reading current Iread is restrained. Accordingly, the possibility of the data inversion of the memory cell 1 is reduced, whereby the data can be stably read from the memory cell 1.

<Others>

The disclosures of Japanese patent application No. JP2006-051017 filed on Feb. 27, 2006 including the specification, drawings and abstract are incorporated herein by reference.

What is claimed is:

1. A semiconductor memory device including a memory cell comprising:

first and second inverters each having an output terminal that is mutually connected to an input terminal of said other first or second inverter;

a first selection transistor controlling a connection of the output terminal of said first inverter to a bit line; and a second selection transistor controlling a connection of the output terminal of said second inverter to another bit line;

wherein said first inverter includes a first load transistor connected to a power source and a first drive transistor connected to the power source via said first load transistor and switched over in its ON/OFF-states, wherein a common terminal between said first load transistor and said first drive transistor forms the output terminal of said first inverter, and a connection terminal connecting a gate of said first load transistor to a gate of said first drive transistor forms the input terminal of said first inverter, wherein said second inverter includes a second load transistor connected to the power source and a second drive transistor connected to the power source via said second load transistor and switched over in its ON/OFF-states, wherein a common terminal between said second load transistor and said second drive transistor forms the output terminal of said second inverter, and a connection terminal connecting a gate of said second load transistor to a gate of said second drive transistor forms the input terminal of said second inverter, wherein when said first inverter is switched ON, said second inverter is switched OFF, and, when said second inverter is switched ON, said first inverter is switched OFF, thus functioning as said memory cell, wherein when writing data to said memory cell, said first selection transistor and said second selection transistor are switched ON thereby to input the data to said second inverter as well as to said first inverter, and, when reading the data from said memory cell, said first selection transistor is switched ON, the data is read from said first inverter while said second selection transistor is switched OFF, and wherein a ratio of a driving current quantity that is outputted in the ON-state of said first drive transistor to a driving current quantity that is outputted in the ON-state of said first selection transistor, is larger than a first predetermined value.

2. The semiconductor memory device according to claim 1, wherein a ratio of a driving current quantity by which said second drive transistor can be driven in the ON-state thereof to a driving current quantity by which said second selection transistor can be driven in the ON-state thereof, is smaller than a second predetermined value.

3. The semiconductor memory device according to claim 1, said memory cells being accessed with row addresses and with column addresses and arrayed two-dimensionally, further comprising:

a row selection circuit controlling said first selection transistor of said plurality of memory cells corresponding to any one of the row addresses; and a column selection circuit capable of selecting all of said memory cells selected by said row selection circuit among said memory cells corresponding to the respective column addresses.

4. The semiconductor memory device according to claim 1, wherein when said first inverter is provided with said first selection transistor by one, the first predetermined value is approximately "2".

5. The semiconductor memory device according to claim 1, wherein when said first inverter is provided with said first selection transistors by two, the first predetermined value is approximately "4".

* * * * *